United States Patent
Qin et al.

(10) Patent No.: US 8,302,840 B2
(45) Date of Patent: Nov. 6, 2012

(54) CLOSED LOOP WIRE BONDING METHODS AND BONDING FORCE CALIBRATION

(75) Inventors: Wei Qin, Lansdale, PA (US); Ziauddin Ahmad, Villanova, PA (US); John David Molnar, Ambler, PA (US); Deepak Sood, New Britain, PA (US); E. Walter Frasch, Perkasie, PA (US); Chunlong Hu, Los Angeles, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 12/297,521

(22) PCT Filed: Oct. 5, 2007

(86) PCT No.: PCT/US2007/080533
§ 371 (c)(1),
(2), (4) Date: Jan. 6, 2010

(87) PCT Pub. No.: WO2008/140541
PCT Pub. Date: Nov. 20, 2008

(65) Prior Publication Data
US 2010/0108744 A1    May 6, 2010

Related U.S. Application Data

(60) Provisional application No. 60/938,274, filed on May 16, 2007.

(51) Int. Cl.
*B23K 31/12* (2006.01)
*B23K 31/00* (2006.01)

(52) U.S. Cl. .................... 228/180.5; 228/103
(58) Field of Classification Search .......... 228/103, 228/180.5, 1.1, 4.5, 110.1, 8, 9
See application file for complete search history.

(56) References Cited

U.S. PATENT DOCUMENTS

| | | | | |
|---|---|---|---|---|
| 4,213,556 A | * | 7/1980 | Persson et al. | 228/104 |
| 4,438,880 A | * | 3/1984 | Smith et al. | 228/1.1 |
| 4,555,052 A | * | 11/1985 | Kurtz et al. | 228/104 |
| 4,597,519 A | * | 7/1986 | Kurtz et al. | 228/102 |
| 5,176,311 A | * | 1/1993 | Levine et al. | 228/180.5 |

(Continued)

FOREIGN PATENT DOCUMENTS
EP    0502674 A    9/1992
(Continued)

OTHER PUBLICATIONS

International Search Report Dated May 27, 2008, International Application No. PCT/US2007/080533.

*Primary Examiner* — Roy King
*Assistant Examiner* — Michael Aboagye
(74) *Attorney, Agent, or Firm* — Christopher M. Spletzer, Sr.

(57) ABSTRACT

A method of applying bonding energy to form a bond between a portion of a wire and a contact of a bonding location using a wire bonding machine is provided. The method includes: (1) moving a bonding tool towards the contact; (2) detecting when a portion of the contact (100a) is pressed against a device supporting surface (112) of the wire bonding machine; and (3) applying bonding energy to the portion of the contact such that a bond is formed between the contact and the portion of wire.

26 Claims, 10 Drawing Sheets

U.S. PATENT DOCUMENTS

| | | | |
|---|---|---|---|
| 5,238,173 A * | 8/1993 | Ura et al. | 228/104 |
| 5,314,105 A * | 5/1994 | Farassat | 228/102 |
| 5,523,956 A * | 6/1996 | Cawelti et al. | 228/104 |
| 5,645,210 A * | 7/1997 | Toner et al. | 228/102 |
| 6,100,594 A | 8/2000 | Fukui et al. | |
| 6,119,926 A | 9/2000 | Egger et al. | |
| 2002/0005576 A1 | 1/2002 | Sakamoto et al. | |

FOREIGN PATENT DOCUMENTS

| | | |
|---|---|---|
| JP | 11204720 A | 7/1999 |

* cited by examiner

CLOSED LOOP WIRE BONDING METHODS AND BONDING FORCE CALIBRATION

CROSS-REFERENCE TO RELATED APPLICATION

This application claims the benefit of U.S. Provisional Application No. 60/938,274, filed May 16, 2007, the contents of which are incorporated herein by reference.

FIELD OF THE INVENTION

The present invention relates to the formation of wire loops, and more particularly, to improved methods of applying bonding energy and/or bonding force during wire bonding.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected.

An exemplary conventional wire bonding sequence includes: (1) forming a free air ball on an end of a wire extending from a bonding tool; (2) forming a first bond on a die pad of a semiconductor die using the free air ball; (3) extending a length of wire in a desired shape between the die pad and a lead of a leadframe; (4) stitch bonding the wire to the lead of the leadframe; and (5) severing the wire. In forming the bonds between (a) the ends of the wire loop and (b) the bond site (e.g., a die pad, a lead, etc.) varying types of bonding energy may be used including, for example, ultrasonic energy, thermosonic energy, thermocompressive energy, amongst others.

In conventional wire bonding systems, the bonding energy (e.g., ultrasonic energy) is typically applied after some level of contact is established between the wire/bonding tool and the contact to which the bond will be made. If the bonding energy is applied when the contact (e.g., a lead of a leadframe) is not "pinned down" undesirable bonds may be formed. More specifically, vibration and related problems may result in over squashed bonds, short wire tail lengths after second bond, etc.

Thus, it would be desirable to provide improved methods of bonding energy application, bonding force application, and related wire bonding methods.

SUMMARY OF THE INVENTION

According to an exemplary embodiment of the present invention, a method of applying bonding energy to form a bond between a portion of a wire and a contact of a bonding location using a wire bonding machine is provided. The method includes: (1) moving a bonding tool towards the contact; (2) detecting when a portion of the contact is pressed against a device supporting surface (e.g., the heat block) of the wire bonding machine; and (3) applying bonding energy to the portion of the contact such that a bond is formed between the contact and the portion of wire (e.g., applying the bonding energy to the wire and the bonding surface at the portion of the contact to form the bond).

According to another exemplary embodiment of the present invention, a method of forming a wire loop to provide interconnection between a first bonding location and a second bonding location of a semiconductor device using a wire bonding machine is provided. The method includes: (1) forming a first bond at the first bonding location with a bonding tool such that a wire engaged with the bonding tool is continuous with the first bond; (2) extending a length of wire from the first bonding location toward the second bonding location; and (3) forming a second bond at the second bonding location such that the wire is continuous from the first bond to the second bond. Step (3) includes: (a) moving a bonding tool towards a contact at the second bonding location, (b) detecting when a portion of the contact is pressed against a device supporting surface of the wire bonding machine, and (c) applying bonding energy to the portion of the contact such that a bond is formed between the contact and the wire. The method also includes (4) severing the wire such that a length of wire engaged in the bonding tool is separated from the wire loop formed in steps (1), (2), and (3).

According to yet another exemplary embodiment of the present invention, a method of determining a bonding force used to bond a portion of a wire to a bonding contact using a wire bonding machine is provided. The method includes: (1) moving a tool to contact a portion of a bonding contact of a device to be wirebonded, the tool applying an initial force to the bonding contact; (2) increasing a force applied to the portion of the bonding contact by the tool until the portion of the bonding contact is pressed against a device supporting surface of the wire bonding machine; and (3) storing a value of the force applied to the portion of the bonding contact through which the bonding contact was pressed against a device supporting surface of the wire bonding machine.

According to yet another exemplary embodiment of the present invention, a method of forming a wire loop to provide interconnection between a first bonding location and a second bonding location of a semiconductor device using a wire bonding machine is provided. The method includes: (1) forming a first bond at the first bonding location with a bonding tool such that a wire engaged with the bonding tool is continuous with the first bond; (2) extending a length of wire from the first bonding location toward the second bonding location; and (3) forming a second bond at a portion of a contact at the second bonding location such that the wire is continuous from the first bond to the second bond. Step (3) includes: (a) determining a bonding force value which presses the portion of the bonding contact against a device supporting surface of the wire bonding machine, (b) applying a total bonding force to the portion of the bonding contact, the total bonding force being greater than or equal to the bonding force value determined in step (a), and (c) applying bonding energy to the bonding contact such that the second bond is formed. The method also includes (4) severing the wire such that a length of wire engaged in the bonding tool is separated from the wire loop formed in steps (1), (2), and (3).

The methods of the present invention may also be embodied as an apparatus (e.g., as part of the intelligence of a wire bonding machine), or as computer program instructions on a computer readable carrier (e.g., a computer readable carrier used in connection with a wire bonding machine).

BRIEF DESCRIPTION OF THE DRAWINGS

The invention is best understood from the following detailed description when read in connection with the accompanying drawing. It is emphasized that, according to common practice, the various features of the drawing are not to scale.

On the contrary, the dimensions of the various features are arbitrarily expanded or reduced for clarity. Included in the drawing are the following figures.

DETAILED DESCRIPTION OF THE INVENTION

Figure 1A:
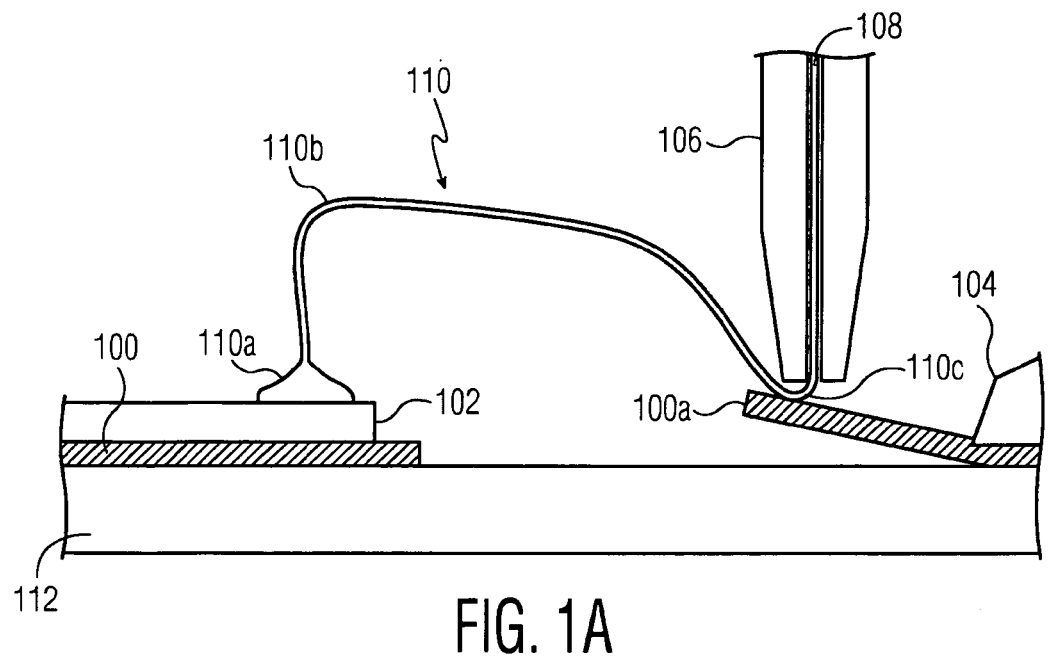
FIG. 1A is a cross-sectional side view of a wire loop during descent to second bond in accordance with an exemplary embodiment of the present invention.

In certain conventional wire bonding applications, bonding energy (e.g., ultrasonic energy, etc.) and bonding force are applied in an "open loop" process. More specifically, bonding energy is applied after physical contact is detected between (1) the tool/wire, and (2) the contact to which the wire will be bonded).

According to certain exemplary embodiments of the present invention, a "closed loop" approach to the bonding energy (e.g., ultrasonic energy, thermosonic energy, thermocompressive energy, amongst others) and/or bonding force application is provided. For example, the bonding energy will be turned on after a portion of a contact (i.e., the portion of the contact to which the wire bond will be made) is pressed against a device supporting surface (e.g., the heat block or other surface to which the contact should be pressed) of the wire bonding machine. The desired condition of the portion of the contact being pressed against the device supporting surface of the wire bonding machine may be referred to as a "pinned down" or "full down" position. Such a condition (i.e., the portion of the contact being pressed against the device supporting surface of the wire bonding machine) may be detected using any of a number of techniques. Certain exemplary techniques are described herein, but the present invention is not limited to these exemplary techniques.

As will be described in greater detail below, exemplary techniques for detecting when the portion of the contact is pressed against the device supporting surface of the wire bonding machine include: (1) detecting when a vertical position of the bonding tool is in a predetermined position; (2) detecting when an impedance characteristic of the transducer reaches a predetermined level; (3) determining when at least one of (a) a bonding force and (b) a velocity of the bonding tool reaches a predetermined level; (4) detecting when a resonance of the transducer reaches a predetermined level; and (5) detecting when a force applied to the portion of the contact has reached a threshold force. By applying the bonding energy (e.g., ultrasonic energy) after ensuring that the contact is in the desired position, resonance problems tend to be substantially reduced, thereby improving the uniformity of bonds formed across a plurality of bonding locations, improving the quality of the bonds formed, improving the yield rate of devices bonded, and reducing the assist rate provided by an operator of the wire bonding machine.

As provided above, an exemplary method of detecting when the portion of the contact is pressed against the device supporting surface of the wire bonding machine is detecting when a force applied to the portion of the contact has reached a threshold force. Such a threshold force may be related to the force (e.g., pin force) used to press the portion of the contact against the device supporting surface. Thus, according to certain exemplary embodiments of the present invention, a pin force calibration is completed whereby the pin force (e.g., the force applied to press the portion of the contact against the device supporting surface) is measured for each of a plurality of contacts (e.g., portions of the leads of a leadframe). The results from the pin force calibration can be used in any of a plurality of techniques, for example: (1) predicting when certain pin force measurements (e.g., excessive variations among pin force measurements of a plurality of leads) tend to show device clamp problems (e.g., part problems, installation problems, etc.) or machine setup problems; and (2) using pin force measurement in connection with setting up bond parameters (e.g., the bond force applied to each contact may be at least equal to the measured pin force, the bond force applied to each contact may be equal to the measured pin force for that contact plus an offset, the bond force applied to each contact may be equal to the largest measured pin force of a plurality of contacts plus an offset, etc.).

FIG. 1A is a partial side view of wire loop 110 providing electrical interconnection between (1) a die pad of semiconductor die 102 and (2) lead 100a of leadframe 100. More specifically, bonding tool 106 (e.g., a capillary tool) is used to extend a length of wire 108 engaged in bonding tool 106 between (1) a die pad of semiconductor die 102 and (2) lead 100*a* of leadframe 100. As is known to those skilled in the art semiconductor die 102 is mounted to leadframe 100 which includes lead 100*a*. Leadframe 100 is positioned on device supporting surface 112 (e.g., heat block 112 or another device supporting surface) of a wire bonding machine. Of course, only a portion of leadframe 100 (and only a portion of lead 100*a* of leadframe 100), semiconductor die 102, and device supporting surface 112 are shown in FIG. 1A. Lead 100*a* is clamped using device clamp 104 (only a small portion of device clamp 104 is shown in FIG. 1A). As is clear in FIG. 1A, the portion of lead 100*a* to which the end of wire loop 110 is to be bonded (a second bond in the example shown in FIG. 1A) is not pressed against device supporting surface 112. This portion of lead 100*a* being "bent" away from device supporting surface 112 may be caused by, for example, high device clamp forces, window clamp geometry issues, heat, and/or a burr or other contaminant, amongst other potential causes. In a conventional "open loop" system for application of bonding energy, bonding energy would be applied upon contact with the portion of lead 100*a* regardless of the fact that it is not pressed against device supporting surface 112. As provided above, the application of the bonding energy to a lead such as lead 100*a* shown in FIG. 1A may result in vibration and related problems, thereby resulting in over squashed bonds, short tails, or the like.

Figure 1B:
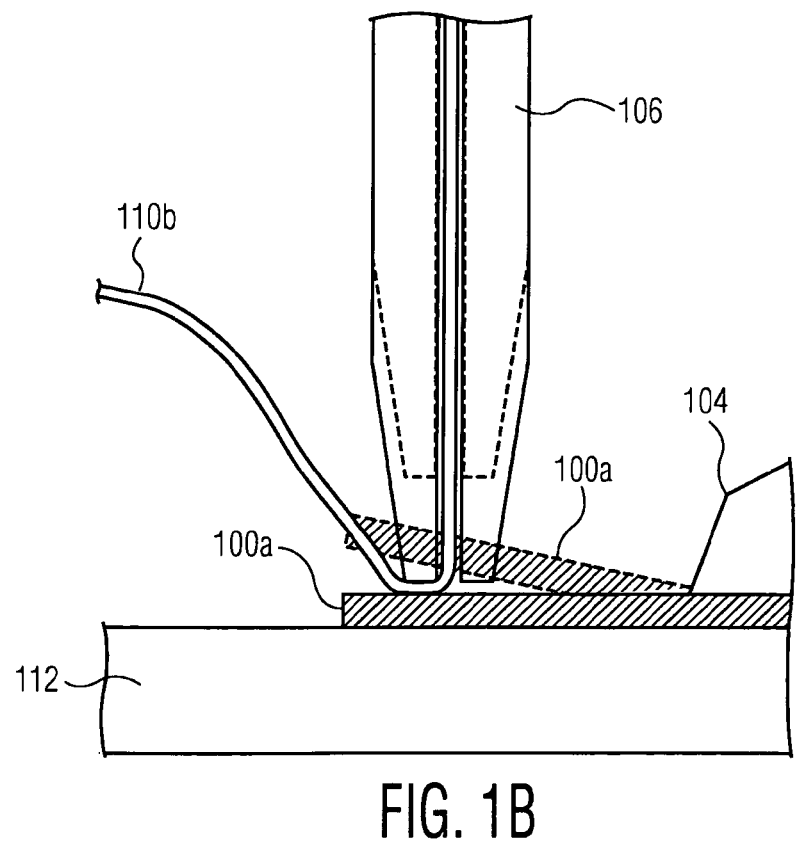
FIG. 1B is a detailed view of a portion of FIG. 1A illustrating a bonding tool pressing a contact against a device supporting surface of a wire bonding machine in accordance with an exemplary embodiment of the present invention.

According to certain exemplary embodiments of the present invention, the bonding energy is not applied to form a bond (e.g., a first bond, a second bond, etc.) until the contact (e.g., lead 100*a*) is pressed against the device supporting surface of a wire bonding machine (e.g., device supporting surface 112). Thus, FIG. 1B illustrates bonding tool 106 descending until the relevant portion of lead 100*a* (i.e., the portion to which the second bond shown in FIG. 1A is to be formed upon) is pressed against device supporting surface 112 as shown in FIG. 1B.

Figure 2A:
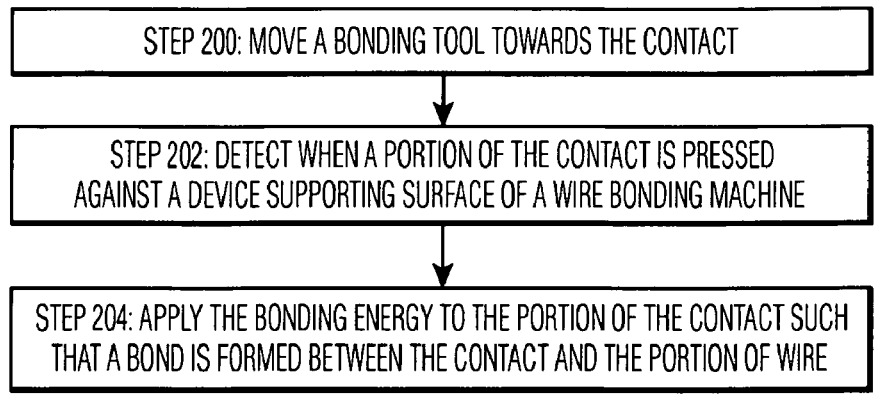
FIG. 2A is a flow diagram illustrating a method of applying bonding energy to form a bond between a portion of a wire and a contact of a bonding location in accordance with an exemplary embodiment of the present invention.
Figure 2B:
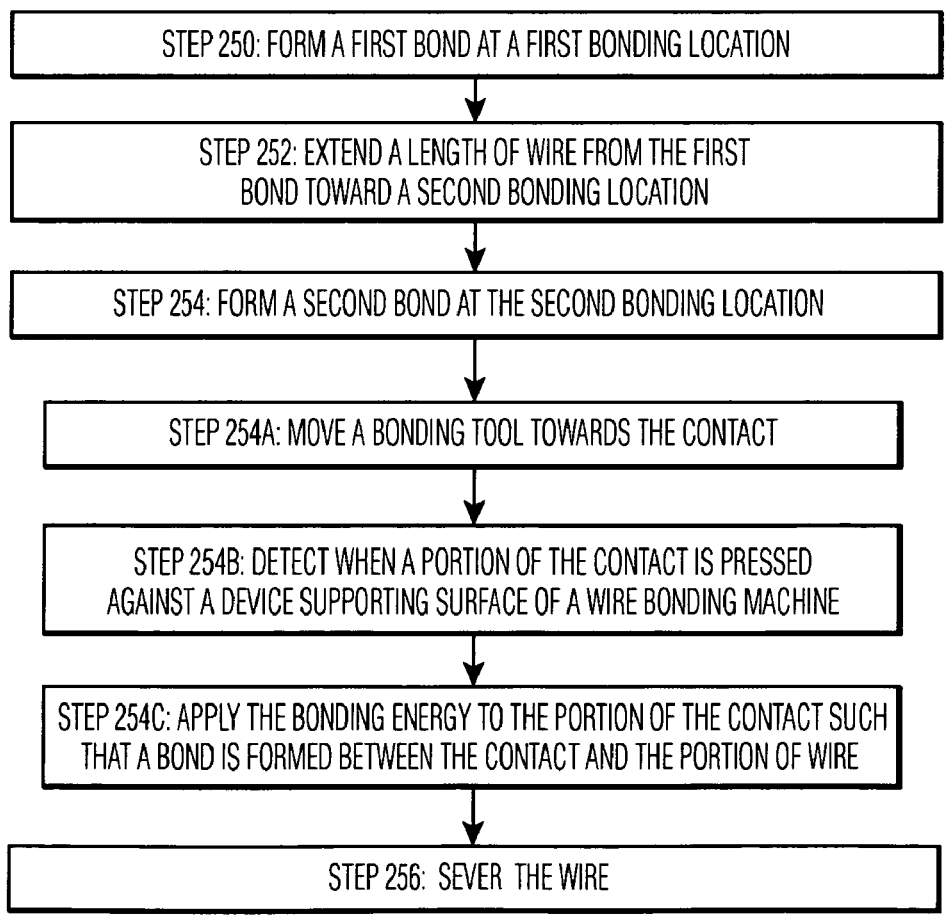
FIG. 2B is a flow diagram illustrating a method of forming a wire loop to provide interconnection between a first bonding location and a second bonding location of a semiconductor device in accordance with an exemplary embodiment of the present invention.

FIGS. 2A-2B are flow diagrams in accordance with certain exemplary embodiments of the present invention. As is understood by those skilled in the art, certain steps included in the flow diagrams may be omitted; certain additional steps may be added; and the order of the steps may be altered from the order illustrated.

FIG. 2A is a flow diagram illustrating a method of applying bonding energy to form a bond between a portion of a wire and a contact of a bonding location using a wire bonding machine in accordance with an exemplary embodiment of the present invention. For example, referring to FIG. 1A again, the method of FIG. 2A could be used in applying bonding energy to form a bond between (1) a portion of wire 108 and (2) lead 100*a* of leadframe 100. At step 200, a bonding tool (e.g., bonding tool 106) is moved towards the contact (e.g., lead 100*a*). At step 202, a process of detecting when a portion of the contact is pressed against a device supporting surface of the wire bonding machine is accomplished (e.g., detecting when the illustrated portion of lead 100*a* is pressed against device supporting surface 112 as shown in FIG. 1B). At step 204, bonding energy (e.g., ultrasonic energy) is applied to the portion of the contact such that a bond (e.g., a second bond in FIGS. 1A-1B) is formed between the contact and the portion of wire.

Step 202 may be accomplished using any of a number of techniques. For example, the detecting step may include detecting when a vertical position of the bonding tool is in a predetermined position. As is known to those skilled in the art of wire bonding, encoder systems, vision systems, and the like may be used to determine when the bonding tool is at a height where the contact (e.g., lead 100*a*) is in a "full down" or "pin down" position as shown in FIG. 1B. This position may be recorded such that during descent to form a bond (e.g., a second bond as shown in FIG. 1B) it is known that this position has been reached, thereby detecting that the contact is pressed against the device supporting surface of the wire bonding machine.

Another technique that may be used to detect when the contact is pressed against the device supporting surface is to detect when an impedance characteristic of the transducer (to which the bonding tool is engaged) reaches a predetermined level. For example, such impedance characteristics may include an impedance magnitude threshold, an impedance magnitude change (or rate of change), an impedance phase threshold or change (or rate of change), a lock frequency change, amongst others. A more specific example of such a detection scheme will be explained below with reference to FIGS. 3A-3B.

Another technique that may be used to detect when the contact is pressed against the device supporting surface is to determine when at least one of (a) a bonding force and (b) a velocity of the bonding tool reaches a predetermined level. A more specific example of such a detection scheme will be explained below with reference to FIGS. 4A-4B.

Another technique that may be used to detect when the contact is pressed against the device supporting surface is to detect when a resonance of the transducer (to which the bonding tool is engaged) reaches a predetermined level.

Another technique that may be used to detect when the contact is pressed against the device supporting surface is to (1) determine a force value that will press the portion of the contact against the device supporting surface of the wire bonding machine, and (2) detect when a force applied to the portion of the contact has reached a threshold force, the threshold force being greater than or equal to the force value determined in step (1). Such a technique may be repeated for each of a plurality of contacts (e.g., leads of a leadframe) of a semiconductor device, whereby the threshold force may be selected to be the same for each of the contacts (such that the selected threshold force is greater than or equal to the largest force value determined in step (1) for any of the plurality of contacts), or the threshold force may be individually selected for each of the plurality of contacts. Whether the threshold force is the same for each of the plurality of contacts, or is individually selected/determined for each of the plurality of contacts, it may be selected in a number of ways. For example, the threshold force may be selected to be equal to the largest force value determined in step (1) for any of the plurality of contacts, or may be the largest value determined in step (1) for any of the plurality of contacts plus a predetermined force offset value. In another example, the threshold force may selected independently for each of the plurality of contacts such that the threshold force selected for each of the plurality of contacts is greater than or equal to the force value determined for the respective one of the plurality of contacts in step (1), or may be selected to be equal to the force value determined for that one of the plurality of contacts in step (1) plus a predetermined force offset value.

Further still, the methods described herein may be applied to contacts (e.g., leads of a leadframe) where multiple bonds (e.g., multiple second bonds) are formed on different portions of the same contact.

Referring now to FIG. 2B, a flow diagram is provided illustrating a method of forming a wire loop to provide interconnection between a first bonding location and a second bonding location of a semiconductor device in accordance with an exemplary embodiment of the present invention. At step 250, a first bond is formed at the first bonding location with a bonding tool such that a wire engaged with the bonding tool is continuous with the first bond. For example, such a first bond is shown in FIG. 1A as first bond 110*a*. At step 252, a length of wire is extended from the first bonding location toward the second bonding location. For example, such a length of wire is shown in FIG. 1A as length 110*b*. At step 254, a second bond is formed at the second bonding location such that the wire is continuous from the first bond to the second bond. For example, a second bond is being formed using portion 110*c* of wire loop 110, where wire portion 110*c* is being bonded against contact 100*a* (e.g., lead 100*a*).

Step 254 includes several steps (or substeps). At step 254A, a bonding tool is moved towards a contact at the second bonding location (e.g., such a moving action is illustrated in FIG. 1B showing the phantom lined bonding tool 106 above contact 100*a*, as well as a solid lined bonding tool 106 which had been moved downward towards (and in this case, in contact with) contact 100*a*. At step 254B, it is detected when a portion of the contact is pressed against a device supporting surface of the wire bonding machine. At step 254C, bonding energy is applied to the portion of the contact such that a bond is formed between the contact and the wire.

At step 256, the wire is severed such that a length of wire engaged in the bonding tool is separated from the wire loop formed in steps 250, 252, and 254.

Of course, step 254 (including steps 254A, 254B, and 254C) may be accomplished using any of a number of methods including those described througout the present application, and specifically including those described above with respect to the method illustrated in FIG. 2A.

Figure 3A:
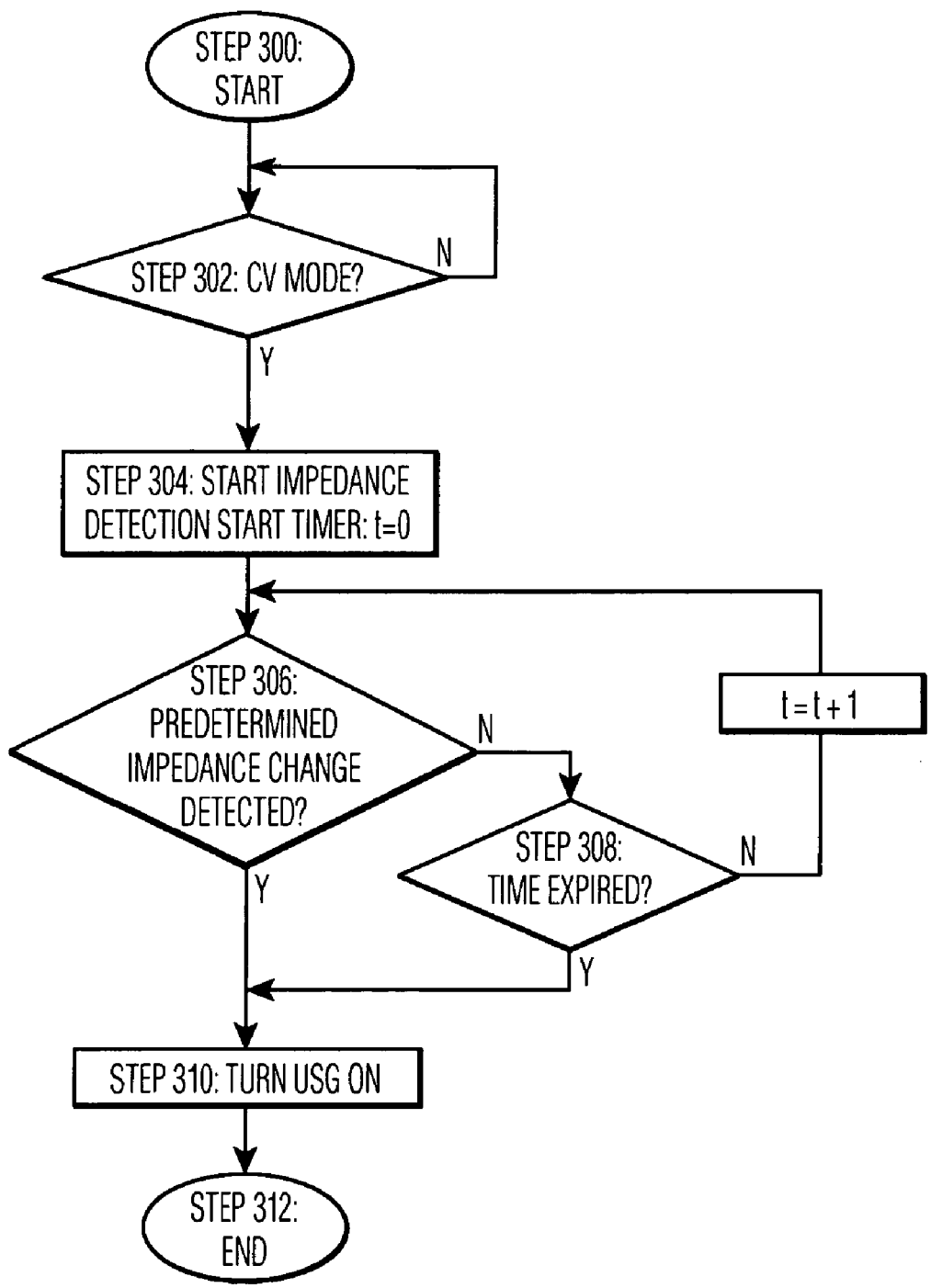
FIG. 3A is a flow diagram illustrating a method of using a system impedance change to detect when a portion of a contact is pressed against a device supporting surface of the wire bonding machine in accordance with an exemplary embodiment of the present invention.
Figure 3B:
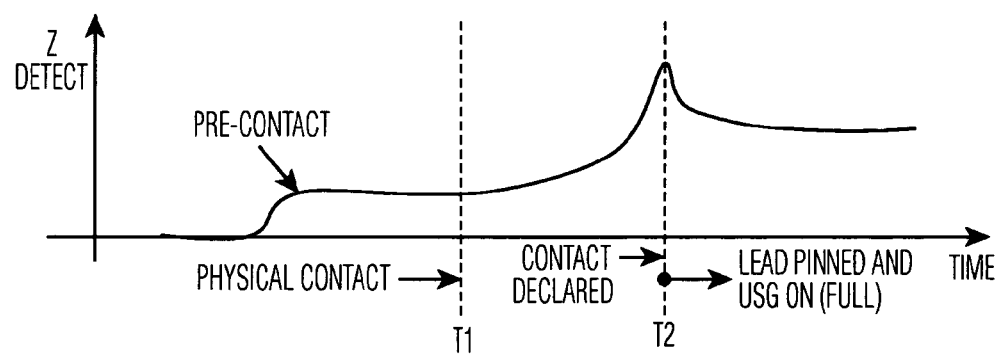
FIG. 3B is a timing diagram of motion of a bonding tool toward a contact, useful for explaining the method illustrated in FIG. 3A, in accordance with an exemplary embodiment of the present invention.

As provided above, in accordance with the present invention, many different methods may be used in order to detect when a portion of a contact is pressed against a device supporting surface of a wire bonding machine. FIGS. 3A-3B are useful in illustrating one exemplary method of such a detection technique.

FIG. 3A is a flow diagram illustrating a method of detecting when a portion of a contact is pressed against a device supporting surface of a wire bonding machine. As is understood by those skilled in the art, certain steps included in FIG. 3A may be omitted; certain additional steps may be added; and the order of the steps may be altered from the order illustrated. At step 300, the method (e.g., the algorithm being run on a computer system associated with a wire bonding machine) is started. At step 302, a determination is made as to whether the bonding tool is in constant/controlled velocity mode (i.e., CV mode). As is known to those skilled in the art, CV mode is a part of the motion cycle of a bonding tool as it lowers toward the bonding location. If CV mode has not yet been entered (a "No" at step 302), then step 302 is repeated. If CV mode has been entered (a "Yes" at step 302), then the method continues to step 304. In accordance with this specific example, the impedance detection at step 304 does not begin until CV mode has been entered; however, this is simply an example. Impedance detection may be constant activated, or such activation may be tied to some other measure (e.g., initial physical contact with the contact).

At step 304, impedance detection is commenced, and a detection start timer is started at t=0. As is understood by those skilled in the art, such impedance detection may utilize a low level of ultrasonic energy (i.e., a low USG current) that may be applied during CV mode. While applying this low level current the impedance (or some characteristic related to impedance) of the transducer is monitored, and upon detection of a change in this impedance beyond a specified threshold ($I_T$) contact is declared and normal bonding energy (e.g., ultrasonic energy) may be applied. As provided above, the impedance characteristic monitored may be any of a number of characteristics including, for example, an impedance magnitude threshold, an impedance magnitude change (or rate of change), an impedance phase threshold or change (or rate of change), a lock frequency change, amongst others.

Referring again to FIG. 3A, at step 306, a determination is made as to whether a predetermined impedance change has been detected. If the predetermined impedance change is detected (a "Yes" answer at step 306), the bonding energy (e.g., ultrasonic energy or USG) is turned on at step 310 such that the bond can be formed. If the predetermined impedance change is not detected (a "No" answer at step 306), a check is made at step 308 to see if time has expired (e.g., a predetermined time period after t=0). If time has not expired (a "No" answer at step 308), an increment is added to the timer (t=t+1), and the process returns to step 306 for another check as to whether the predetermined impedance change has been detected. If time has expired (a "Yes" answer at step 308), then the bonding energy (e.g., ultrasonic energy or USG) is turned on at step 310 such that the bond can be formed. In this exemplary embodiment the assumption is that if the time has expired at step 308 that the relevant portion of the contact has been pressed against the device supporting surface of the wire bonding machine and that the bonding process can proceeed (or it may be viewed as better to continue the process on the assumption that the relevant portion of the contact has been pressed against the device supporting surface as opposed to undesirably interrupting the bonding process). At step 312, the process (e.g., the algorithm running on the wire bonding machine) has been completed. Of course, the method illustrated in FIG. 3A may be repeated for multiple contacts of a semiconductor device, or may be repeated multiple times for a single contact (where such single contact may be configured to be bonded to multiple times).

FIG. 3B is a timing diagram of motion of a bonding tool toward a contact, useful for explaining the method illustrated in FIG. 3A. More specifically, the y-axis is labelled as "Z DETECT" and relates to an impedance characteristic being monitored for a threshold value or threshold change. The x-axis is time. Before time "T1" is the pre-contact period where the bonding tool has not yet touched the contact (e.g., lead). At time T1, the bonding tool has made physical contact with the contact (e.g., lead) and there is a change in the impedance characteristic from T1 to T2. At time T2, the contact has been pressed against the device supporting surface of the wire bonding machine (e.g., the lead is "pinned") as evidenced by the impedance detection scheme detecting that the predetermined impedance threshold value or threshold change has been met.

Figure 4A:
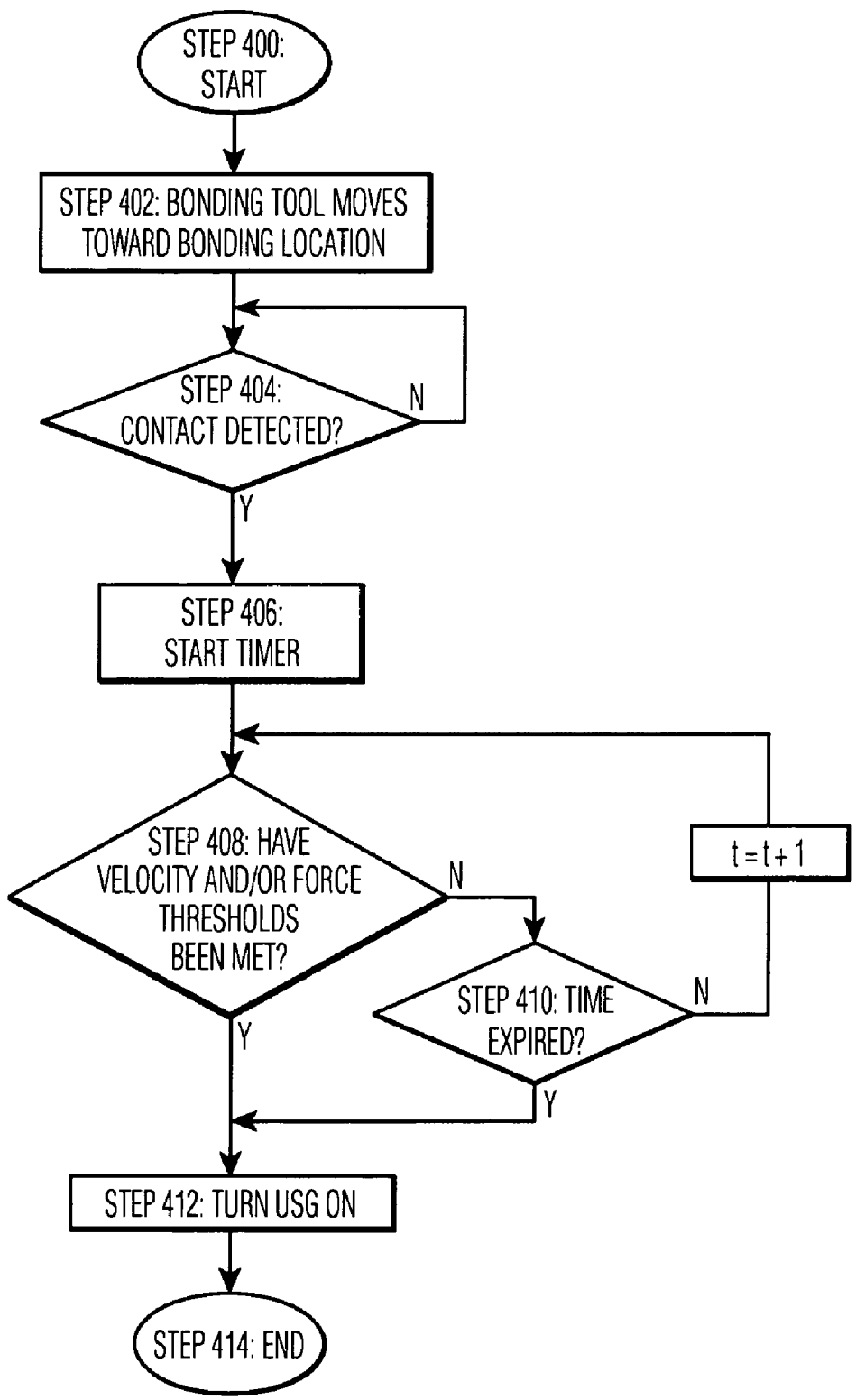
FIG. 4A is a flow diagram illustrating another method of detecting when a portion of a contact is pressed against a device supporting surface of the wire bonding machine in accordance with an exemplary embodiment of the present invention.
Figure 4B:
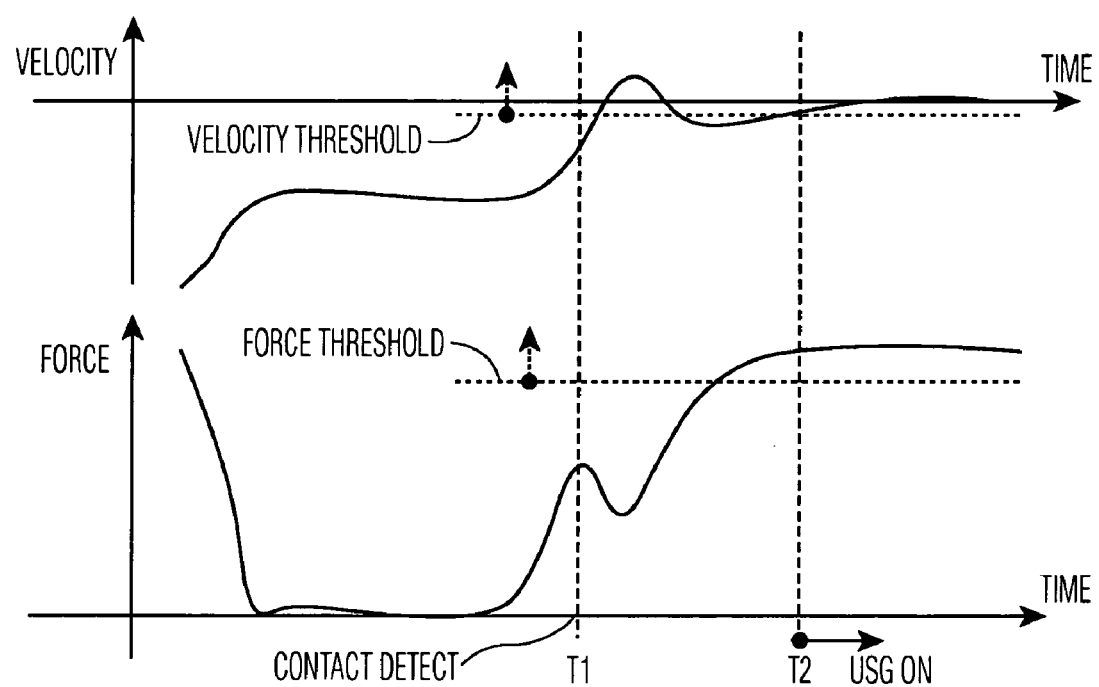
FIG. 4B are velocity and force timing diagrams of a bonding tool during motion toward a contact, useful for explaining the method illustrated in FIG. 4A, in accordance with an exemplary embodiment of the present invention.

FIG. 4A is a flow diagram illustrating another exemplary method of detecting when a portion of a contact is pressed against a device supporting surface of the wire bonding machine. In this method, a determination is made as to whether at least one of (a) a bonding force and (b) a velocity of the bonding tool reaches a predetermined level. In the example of FIGS. 4A-4B, the determination is described with respect to both bonding force and velocity; however, it is understood that one of the characteristics may be monitored in detecting when a portion of a contact is pressed against a device supporting surface of a wire bonding machine. As is understood by those skilled in the art, certain steps included in FIG. 4A may be omitted; certain additional steps may be added; and the order of the steps may be altered from the order illustrated.

At step 400, the method (e.g., the algorithm being run on a computer system associated with a wire bonding machine) is started. At step 402, a bonding tool is moved towards a bonding location (e.g., a contact such as a lead of a leadframe). At step 404, a determination is made as to whether contact has been detected between the bonding tool and the contact (e.g., lead). If contact has not been detected (a "No" at step 404), then step 404 is repeated. If contact has been detected (a "Yes" at step 404), then the method continues to step 406.

At step 406 a timer is started at t=0. At step 408, a determination is made as to whether the velocity and/or force thresholds have been met. If the velocity and/or force thresholds have been met (a "Yes" answer at step 408), the bonding energy (e.g., ultrasonic energy or USG) is turned on at step 412 such that the bond can be formed. If the velocity and/or force thresholds have not been met (a "No" answer at step 408), a check is made at step 410 to see if time has expired (e.g., a predetermined time period after t=0). If time has not expired (a "No" answer at step 410 an increment is added to the timer (t=t+1), and the process returns to step 408 for another check as to whether the velocity and/or force thresholds have been met. If time has expired (a "Yes" answer at step 410), then the bonding energy (e.g., ultrasonic energy or USG) is turned on at step 412 such that the bond can be formed. In this exemplary embodiment the assumption is that if the time has expired at step 412 that the relevant portion of the contact has been pressed against the device supporting surface of the wire bonding machine and that the bonding process can proceed (or it may be viewed as better to continue the process on the assumption that the relevant portion of the contact has been pressed against the device supporting surface as opposed to undesirably interupting the bonding process). At step 414 the process (e.g., the algorithm running on the wire bonding machine) has been completed. Of course, the method illustrated in FIG. 4A may be repeated for multiple contacts of a semiconductor device, or may be repeated multiple times for a single contact (where such single contact may be configured to be bonded to multiple times).

FIG. 4B is a timing diagram of motion of a bonding tool toward a contact, useful for explaining the method illustrated in FIG. 3A. More specifically, the y-axes are labelled as "VELOCITY" and "FORCE" and they relate to the velocity of the bonding tool, and the force applied by the bonding tool to the contact. The x-axis is time. According to an exemplary embodiment of the present invention, in order to determine when a portion (that is, the relevant portion of the contact to be bonded with a wire) of a contact is pressed against a device supporting surface of a wire bonding machine, the velocity should be substantially zero (e.g., the velocity must reach a velocity threshold as shown in FIG. 4B) and the bonding force being applied should reach a predetermined threshold (e.g., a force threshold as shown in FIG. 4B). Before time "T1" both the velocity and force signals are in a relatively constant state (very little slope) followed by a sharp change in slope as the time approaches T1. Between time T1 and time T2 there are changes to both the velocity and force signals, but at time T2 both thresholds have been met. That is, after time T2, (1) the velocity signal is above the velocity threshold (e.g., the bonding tool has stopped moving), and has stabilized, and (2) the force signal is above the force threshold. Thus, the contact has been pressed against the device supporting surface of the wire bonding machine (e.g., the lead is "pinned") at time T2, and the bonding energy may now be applied.

The bonding force threshold used in connection with the method of FIGS. 4A-4B may be a user defined threshold, or may be determined in conjunction with a force calibration measurement (i.e., a measurement which determines how much force is used to press the portion of the contact against the device supporting surface of the wire bonding machine). Such bonding force calibration techniques are described with respect to FIGS. 5A-5B and FIGS. 7A-7B.

Figure 5A:
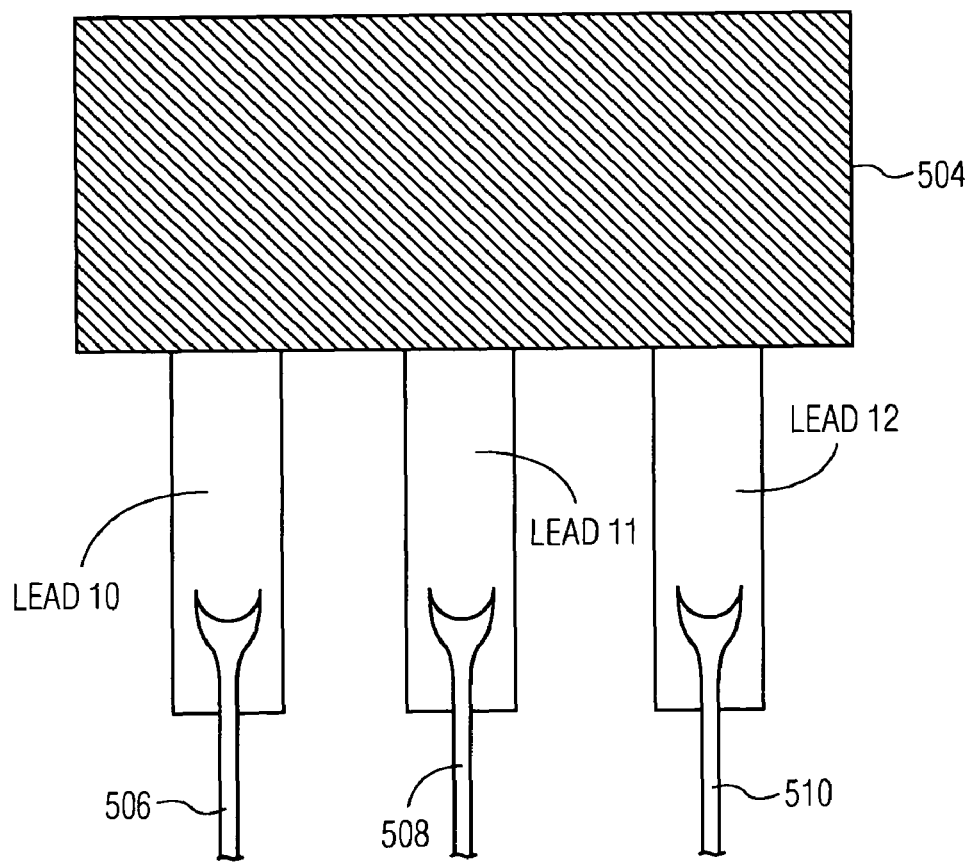
FIG. 5A is a partial top view of three adjacent contacts of a semiconductor device, and a portion of a device clamp in contact with the contacts, in accordance with an exemplary embodiment of the present invention.

In contrast to the side view shown in FIGS. 1A-1B of a portion of lead 100*a* and device clamp 104, FIG. 5A is a top view of 3 adjacent leads (the portions of those leads) and a portion of a device clamp. More specifically, FIG. 5A illustrates lead 10, lead 11, and lead 12 of a leadframe. The leads (and others of the device not shown) are "clamped" by device clamp 504 (only a small portion of device clamp 504 is shown in block form in FIG. 5A). Also shown are the ends of three wire loops 506, 508, and 510. Each of wire loops 506, 508, and 510 have been stitch bonded as a second bond on respective ones of leads 10, 11, and 12, as shown.

Figure 5B:
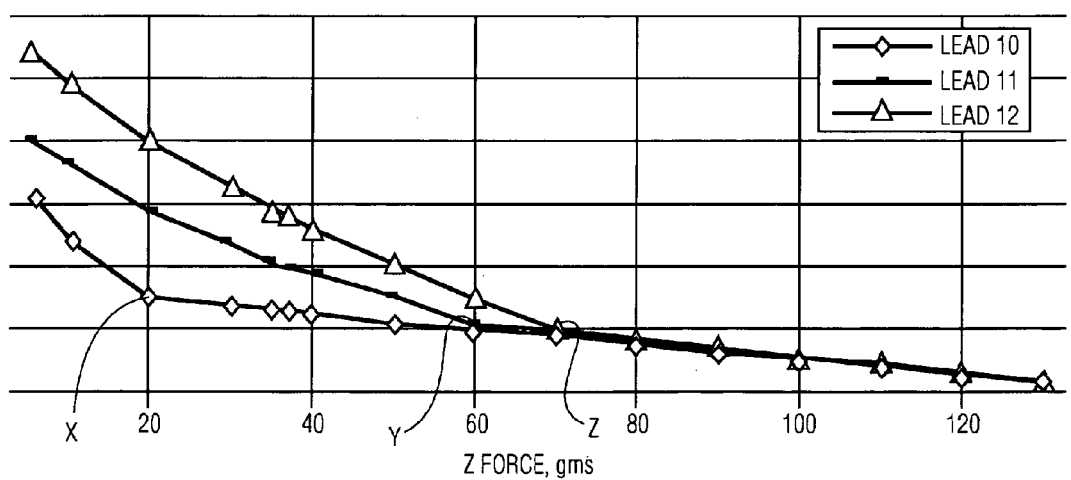
FIG. 5B is a chart illustrating force versus vertical position data for the three adjacent contacts illustrated in FIG. 5A in accordance with an exemplary embodiment of the present invention.

FIG. 5B is a chart illustrating force versus vertical position data for the three adjacent leads of FIG. 5A. More specifically, as the vertical position of a bonding tool contacting each of leads 10, 11, and 12 is changed (as the Z-position along the y-axis decreases) the force applied to the lead is also changing (the force along the x-axis increases). Stated differently, in order to continue to lower the Z-position (e.g., the vertical position) of the tool additional force is applied. The three "curves" shown in FIG. 5B each correspond to one of leads 10, 11, and 12 (as made clear by the legend of FIG. 5B). Thus, the curve corresponding to lead 10 (the bottom curve on FIG. 5B) has a substantial slope change at point "X" (i.e., at about 20 grams of force and at about 0.3 mils in Z-position). Likewise, the curve corresponding to lead 11 (the middle curve on FIG. 5B) has a substantial slope change at point "Y" (i.e., at about 60 grams of force and at about 0.21 mils in Z-position). Likewise, the curve corresponding to lead 12 (the top curve on FIG. 5B) has a substantial slope change at point "Z" (i.e., at about 70 grams of force and at about 0.20 mils in Z-position). This slope change is substantially related to a point which approximately delineates (1) spring force of a lead, from (2) forces need to overcome certain system components (e.g., stiffness related to the bond head, the heat block, etc.). More specifically, the left portion of each curve (i.e., the portion to the left of points X, Y, and Z) substantially corresponds to the force used to overcome the spring force of the lead, that is, the spring force overcome in order to press the portion of the lead against a device supporting surface (e.g., a heat block) of a wire bonding machine (the right hand portion of each curve corresponds to the system forces to be overcome such as stiffness relateds to the bond head and the heat block). Thus, in order to overcome the spring force of the leads 10, 11, and 12, bond forces of 20, 60, and 70 grams respectively may be applied. Thus, by applying a varying force to each of a plurality of leads the force used to press the relevant portion of the lead against a device supporting surface (e.g., a heat block) of a wire bonding machine may be determined, for example, by determining the point at which the curve changes slope. Thus, it may be approximated that lead 10 will use 20 grams of force (see point X in FIG. 5B) in order to press the relevant portion of lead 10 against a device supporting surface (e.g., a heat block) of a wire bonding machine. Of course, this process may be automated using a computer algorithm or the like to determine the appropriate force value for each lead (e.g., an algorithm may be configured to incrementally increase the applied bond force, then determine the Z position at each increment, and ultimately determine the point where the lead is pressed against the device supporting surface, that is, the point of slope change). Further, this process may be repeated for each lead in a separate process prior to actual performing the wire bonding process.

Figure 6:
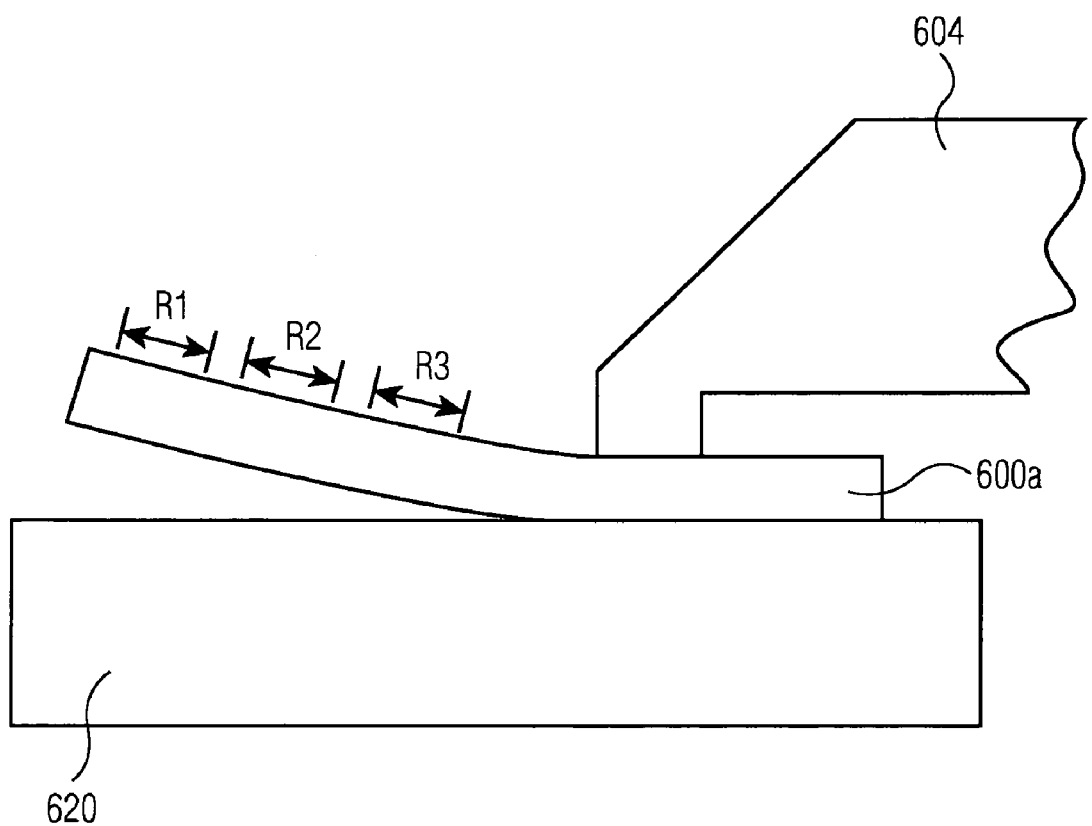
FIG. 6 is a partial side view of a contact of a semiconductor device and a portion of a device clamp in accordance with an exemplary embodiment of the present invention.

In contrast to the top view of contacts 10, 11, and 12 (i.e., leads 10, 11, and 12) in FIG. 5A, FIG. 6 is a partial side view of a similar contact 600*a* (i.e., lead 600*a* of a leadframe). FIG. 6 also illustrates a portion of device clamp 604 and a portion of device supporting surface 620 (e.g., heat block 620) of a wire bonding machine. As is clear from FIG. 6A, a portion of lead 600*a* is raised above device supporting surface 620. For the reasons set forth above, it would be desirable to press this portion of lead 600*a* against device supporting surface 600*a* prior to forming a wire bond on this portion of lead 600*a*. In this example, multiple wire bonds may be formed on this portion of contact 600*a*. More specifically, a number of wire bonds (e.g., second bonds which may be stitch bonds) may be formed in each of regions R1, R2, and R3 of lead 600*a* (i.e., bonding locations R1, R2, and R3). As is known to those skilled in the art, an exemplary application where multiple wire bonds may be formed on the same lead include stacked die applications, multi-tiered applications, amongst others. In order to press/pin the relevant portion of contact 600*a* (e.g., portion R1, portion R2, portion R3, etc.) against device supporting surface 620, different forces may be used. That is, in order to press portion R1 against device supporting surface 620 less force will likely be used in comparison to the force that may be used to press portion R3 against device supporting surface 620. In certain contacts such as lead 600*a* illustrated in FIG. 6, the force used to press the lead against the device supporting surface tends to increase the closer you come to the device clamp. Thus, in FIG. 6, pressing contact 600*a* against device supporting surface 620 tends to use less force at bonding location R1 than at bonding location R2. Likewise, pressing contact 600*a* against device supporting surface 620 tends to use less force at bonding location R2 than at bonding location R3. With this in mind, when detecting when a portion of a contact is pressed against a device supporting surface of a wire bonding machine (e.g., as in step 202 of FIG. 2A, as in step 254B of FIG. 2B, etc.) such detection may be repeated for different portions (e.g., such as bonding locations R1, R2, and R3) of the contact.

Figure 7A:
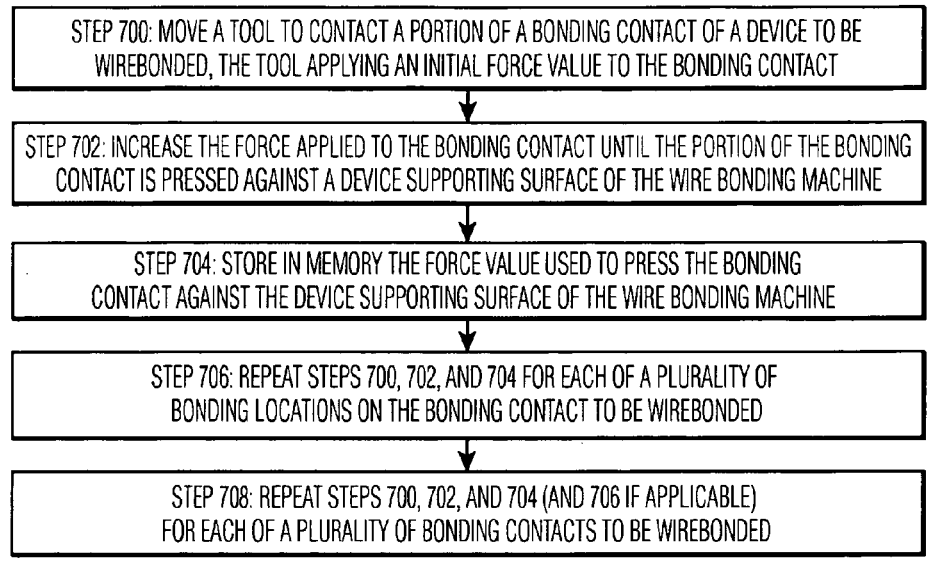
FIG. 7A is a flow diagram illustrating a method of determining a bonding force used to bond a portion of a wire to a bonding contact in accordance with an exemplary embodiment of the present invention.
Figure 7B:
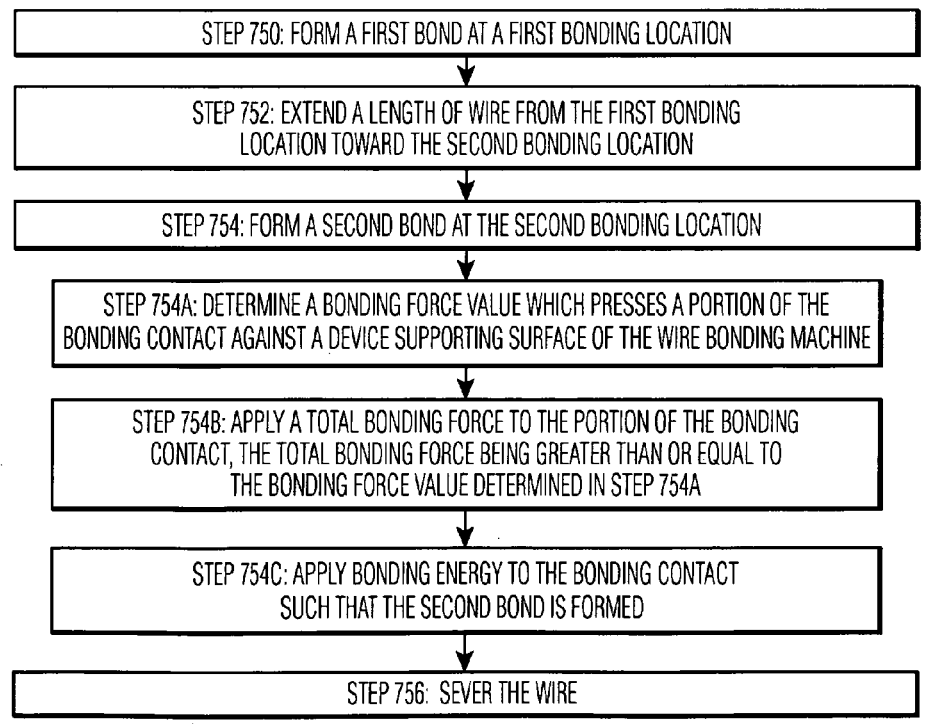
FIG. 7B is a flow diagram illustrating a method of forming a wire loop to provide interconnection between a first bonding location and a second bonding location of a semiconductor device in accordance with an exemplary embodiment of the present invention.

FIGS. 7A-7B are flow diagrams in accordance with certain exemplary embodiments of the present invention. As is understood by those skilled in the art, certain steps included in the flow diagrams may be omitted; certain additional steps may be added; and the order of the steps may be altered from the order illustrated.

FIG. 7A is a flow diagram illustrating a method of determining a bonding force used to bond a portion of a wire to a bonding contact in accordance with an exemplary embodiment of the present invention. This method may be accomplished concurrently with the bonding process (i.e., the force may be determined for a specific contact and then applied after said determination in connection with the bonding process) or the method may be accomplished prior to the bonding process (e.g., the force for a number of contacts may be determined, and then the bonding process may be completed after the determinations are made). At step 700, a tool is moved to contact a portion of a bonding contact of a device to be wirebonded. The tool applies an initial force to the bonding contact. At step 702, the force applied to the portion of the bonding contact is increased by the tool until the portion of the bonding contact is pressed against a device supporting surface of the wire bonding machine. For example, the force may be incrementally increased (e.g., using a predetermined increment of force) until the portion of the bonding contact is pressed against a device supporting surface of the wire bonding machine.

At step 704, a value of the force applied to the portion of the bonding contact through which the bonding contact was pressed against a, device supporting surface of the wire bonding machine is stored in memory (e.g., stored in memory of a computer of a wire bonding machine). At step 706, steps 700, 702, and 704 are repeated for a plurality of bonding locations of the bonding contact (e.g., such as the bonding locations R1, R2, and R3 on contact/lead 600*a* of FIG. 6). At step 708, steps 700, 702, and 704 are repeated for a plurality of bonding contacts of a device to be wirebonded (e.g., such as contacts/leads 10, 11, and 12 of FIG. 5A).

As provided above, the method illustrated in FIG. 7A may include additional steps. For example, the method may include a further step of recording each of a plurality of positions of the tool along a substantially vertical axis during the step of incrementally increasing the force applied to the portion of the bonding contact such that each of the plurality of positions corresponds to a force applied to the portion of the bonding contact. For example, after the tool contacts the contact (but prior to the contact being pressed against the device supporting surface of the wire bonding machine) each of a plurality of positions of the tool along the Z-axis may be recorded along with the corresponding force applied. An example of this type of data is shown in FIG. 5B described above. Referring to lead 10 of FIG. 5B, a first data point includes a vertical position recorded at approximately 0.6 mils and approximately 6 grams of force. The second data point of lead 10 in FIG. 5B includes a vertical position recorded at approximately 0.48 mils and approximately 11 grams of force. For example, this data may be used to determine when the slope of the curve changes, as described above with respect to FIG. 5B.

The method of FIG. 7A may also include a step of calculating a total force value to be applied to the portion of the bonding contact during a bonding operation. For example, the total force value may be the force determined for each individual contact. In another example, the total force value may be the highest force value determined for a plurality of contacts. In yet another example, the step of calculating the total force value may include adding (a) a predetermined force offset value to (b) the bonding force applied to the portion of bonding contact in step 702 which causes the portion of the bonding contact to be pressed against a device supporting surface of the wire bonding machine. Again, this predetermined force offset value may be added to the individual force determined for each contact (or portion of a contact as in FIG. 6), or this force offset value may be added to the highest force value determined for a plurality of contacts.

FIG. 7B is a flow diagram illustrating a method of forming a wire loop to provide interconnection between a first bonding location and a second bonding location of a semiconductor device in accordance with an exemplary embodiment of the present invention. At step 750, a first bond is formed at the first bonding location with a bonding tool such that a wire engaged with the bonding tool is continuous with the first bond. At step 752, a length of wire is extended from the first bonding location toward the second bonding location. At step 754, a second bond is formed at a portion of a contact at the second bonding location such that the wire is continuous from the first bond to the second bond.

Step 754 includes several steps (or substeps). At step 754A, a bonding force value is determined which presses the portion of the bonding contact against a device supporting surface of the wire bonding machine. At step 754B, a total bonding force is applied to the portion of the bonding contact, the total bonding force being greater than or equal to the bonding force value determined in step 754A. At step 754C, bonding energy is applied to the bonding contact such that the second bond is formed. At step 756, the wire is severed such that a length of wire engaged in the bonding tool is separated from the wire loop formed in steps 750, 752, and 754.

As with the above described embodiments of the present invention, the steps of the method illustrated in FIG. 7B may be repeated to form a plurality of wire loops such that step 754 is repeated for each of a plurality of contacts of the semiconductor device.

In certain exemplary embodiments of the present invention related to the method of FIG. 7B, the total bonding force applied at step 754B may be selected to be the same for each of the plurality of contacts, whereby the selected total bonding force is greater than or equal to the largest bonding force value determined in step 754A for any of the plurality of contacts. For example, if the bonding force value is determined for three leads (e.g., where the force values for the three leads measured 25 grams, 40 grams, and 50 grams), then the selected total bonding force would be greater than or equal to 50 grams for each lead. In another example, the selected total bonding force may be equal to the largest bonding force value determined in step 754A for any of the plurality of contacts plus a predetermined force offset value. Thus, if 50 grams is the largest bonding force value determined, and the predetermined offset value is 20 grams, then the selected total bonding force would be 70 grams for each lead.

In certain other exemplary embodiments of the present invention related to the method of FIG. 7B, the total bonding force applied to each of the contacts in step 754B may be selected independently for each of the plurality of contacts, whereby the total bonding force selected for each of the plurality of contacts is greater than or equal to the force value determined for the respective one of the plurality of contacts in step 754A. For example, if the bonding force value is determined for three leads (e.g., where the force values for the three leads measured 25 grams, 40 grams, and 50 grams), then the selected total bonding force for the first lead would be greater than or equal to 25 grams, the selected total bonding force for the second lead would be greater than or equal to 40 grams, and the selected total bonding force for the third lead would be greater than or equal to 50 grams. In another example, the selected total bonding force may be equal to the force value determined for the respective one of the plurality of contacts in step 754A plus a predetermined force offset value. Thus, if the predetermined offset value is 20 grams, then the selected total bonding force for the first lead would be 45 grams (i.e., 25 grams plus 20 grams offset), the selected total bonding force for the second lead would be 60 grams (i.e., 40 grams plus 20 grams offset), and the selected total bonding force for the third lead would be 70 grams (i.e., 50 grams plus 20 grams offset).

As with the above described embodiments of the present invention, the steps of the method illustrated in FIG. 7B may be repeated to form a plurality of wire loops where each of the plurality of wire loops is bonded to respective portions of a single contact (i.e., a plurality of wire loops are formed between respective first bond locations and respective portions of the single contact, as with the portions R1, R2, and R3 of contact 600a in FIG. 6).

Although the present invention has been described primarily with respect to bonding a portion of a wire to a contact where the contact is a lead of a leadframe, it is not limited thereto. The techniques disclosed herein may be applied to any type of contact including leads, pads, traces, of any type of device (e.g., a leadframe, a substrate other than a leadframe, a semiconductor die, etc.). As is known to those skilled in the art, the "device supporting surface" of a wire bonding machine (as that term is used herein) may be different depending upon the application, and also depending upon the contact being bonded to. For example, in the case of the contact being a lead of a leadframe, the device supporting surface may be, for example, a heat block (amongst many other possible device supporting surfaces). If the contact is a pad on a die, the device supporting surface may be the die surface to which the pad must be pressed. Thus, it is clear that the device supporting surface may be whatever surface the contact should be pressed against for bonding to the contact.

Likewise, the techniques herein may be applied to any type of looping process. For example, the techniques may be applied to formation of a wire bond at (1) a first bond location, (2) a second bond location, (3) both a first bond location and a second bond location, etc. Thus, prior to forming a first bond at a first bond location (e.g., ball bond 100a in FIG. 1A) the techniques described herein may be used to make sure that the contact (e.g., a die pad of semiconductor die 102 in FIG. 1A) is pressed against a device supporting surface prior to application of bonding energy to the form the first bond.

The techniques of the present invention may be implemented in a number of alternative mediums. For example, the techniques can be installed on an existing computer system/server as software (a computer system used in connection with, or integrated with, a wire bonding machine). Further, the techniques may operate from a computer readable carrier (e.g., solid state memory, optical disc, magnetic disc, radio frequency carrier medium, audio frequency carrier medium, etc.) that includes computer instructions (e.g., computer program instructions) related to the techniques.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of applying bonding energy to form a bond between a portion of a wire and a contact of a bonding location using a wire bonding machine, the method comprising the steps of:
   (1) moving a bonding tool towards the contact;
   (2) detecting when a portion of the contact is pressed against a device supporting surface of the wire bonding machine; and
   (3) applying ultrasonic bonding energy to the portion of the contact after step (2) such that a bond is formed between the contact and the portion of wire,
   wherein the ultrasonic bonding energy is applied at step (3) after a predetermined period of time lapses even if the portion of the contact has not been detected to be pressed against the device supporting surface at step (2).

2. The method of claim 1 wherein step (2) includes detecting when a vertical position of the bonding tool is in a predetermined position.

3. The method of claim 1 wherein the bonding tool is engaged with a transducer of the wire bonding machine, and wherein step (2) includes detecting when an impedance characteristic of the transducer reaches a predetermined level.

4. The method of claim 1 wherein step (2) includes determining when at least one of (a) a bonding force and (b) a velocity of the bonding tool reaches a predetermined level.

5. The method of claim 1 wherein the bonding tool is engaged with a transducer of the wire bonding machine, and wherein step (2) includes detecting when a resonance of the transducer reaches a predetermined level.

6. The method of claim 1 further comprising the step of (4) determining a force value that will press the portion of the contact against the device supporting surface of the wire bonding machine, and step (2) includes detecting when a force applied to the portion of the contact has reached a threshold force, the threshold force being greater than or equal to the force value determined in step (4).

7. The method of claim 1 wherein steps (1), (2), and (3) are repeated for each of a plurality of contacts of a semiconductor device.

8. The method of claim 7 further comprising the step of (4) determining a force value that will press the portion of the contact against the device supporting surface of the wire bonding machine, wherein step (4) is repeated for each of the plurality of contacts of the semiconductor device, and wherein step (2) includes detecting when a force applied to the contact has reached a threshold force, the threshold force being greater than or equal to the force value determined in step (4).

9. The method of claim 8 wherein the threshold force is selected to be the same for each of the plurality of contacts such that the selected threshold force is greater than or equal to the largest force value determined in step (4) for any of the plurality of contacts.

10. The method of claim 9 wherein the selected threshold force is equal to the largest force value determined in step (4) for any of the plurality of contacts plus a predetermined force offset value.

11. The method of claim 8 wherein the threshold force is selected independently for each of the plurality of contacts such that the threshold force selected for each of the plurality of contacts is greater than or equal to the force value determined for the respective one of the plurality of contacts in step (4).

12. The method of claim 11 wherein the selected threshold force for each of the plurality of contacts is equal to the force value determined for that one of the plurality of contacts in step (4) plus a predetermined force offset value.

13. The method of claim 1 wherein steps (1), (2), and (3) are repeated for each of a plurality of portions of the contact such that bonds are formed between each of the portions of the contact and respective portions of the wire.

14. A method of forming a wire loop to provide interconnection between a first bonding location and a second bonding location of a semiconductor device using a wire bonding machine, the method comprising the steps of:
 (1) forming a first bond at the first bonding location with a bonding tool such that a wire engaged with the bonding tool is continuous with the first bond;
 (2) extending a length of wire from the first bonding location toward the second bonding location;
 (3) forming a second bond at the second bonding location such that the wire is continuous from the first bond to the second bond, the step of forming a second bond including:
  (a) moving a bonding tool towards a contact at the second bonding location,
  (b) detecting when a portion of the contact is pressed against a device supporting surface of the wire bonding machine; and
  (c) applying ultrasonic bonding energy to the portion of the contact after step (b) such that a bond is formed between the contact and the wire, wherein the ultrasonic bonding energy is applied to the portion of the contact at step (c) even if the portion of the contact has not been detected to be pressed against the device supporting surface at step (b) within a predetermined period of time; and (4) severing the wire such that a length of wire engaged in the bonding tool is separated from the wire loop formed in steps (1), (2), and (3).

15. The method of claim 14 wherein step (b) includes detecting when a vertical position of the bonding tool is in a predetermined position.

16. The method of claim 14 wherein the bonding tool is engaged with a transducer of the wire bonding machine, and wherein step (b) includes detecting when an impedance characteristic of the transducer reaches a predetermined level.

17. The method of claim 14 wherein step (b) includes determining when at least one of (1) a bonding force and (2) a velocity of the bonding tool reaches a predetermined level.

18. The method of claim 14 wherein the bonding tool is engaged with a transducer of the wire bonding machine, and wherein step (b) includes detecting when a resonance of the transducer reaches a predetermined level.

19. The method of claim 14 wherein step (3) further comprises the step of (d) determining a force value that will press the portion of the contact against the device supporting surface of the wire bonding machine, and step (b) includes detecting when a force applied to the portion of the contact has reached a threshold force, the threshold force being greater than or equal to the force value determined in step (d).

20. The method of claim 14 wherein steps (1), (2), (3), and (4) are repeated to form a plurality of wire loops such that step (3) is repeated for each of a plurality of contacts of the semiconductor device.

21. The method of claim 20 wherein step (3) further comprises the step of (d) determining a force value that will press the portion of the contact against the device supporting surface of the wire bonding machine, wherein step (d) is repeated for each of the plurality of contacts, and wherein step (b) includes detecting when a force applied to the contact has reached a threshold force, the threshold force being greater than or equal to the force value determined in step (d).

22. The method of claim 21 wherein the threshold force is selected to be the same for each of the plurality of contacts such that the selected threshold force is greater than or equal to the largest force value determined in step (d) for any of the plurality of contacts.

23. The method of claim 22 wherein the selected threshold force is equal to the largest force value determined in step (d) for any of the plurality of contacts plus a predetermined force offset value.

24. The method of claim 21 wherein the threshold force is selected independently for each of the plurality of contacts such that the threshold force selected for each of the plurality of contacts is greater than or equal to the force value determined for the respective one of the plurality of contacts in step (d).

25. The method of claim 24 wherein the selected threshold force for each of the plurality of contacts is equal to the force value determined for that one of the plurality of contacts in step (d) plus a predetermined force offset value.

26. The method of claim 14 wherein steps (1), (2), (3), and (4) are repeated to form a plurality of wire loops such that step (3) is repeated for each of a plurality of portions of the contact such that a plurality of wire loops are formed between respective first bond locations and respective portions of the contact.

* * * * *